(12) United States Patent
Dionne et al.

(10) Patent No.: US 9,520,886 B2
(45) Date of Patent: Dec. 13, 2016

(54) METHODS AND DEVICES FOR ERROR CORRECTION OF A SIGNAL USING DELTA SIGMA MODULATION

(71) Applicant: Smart Energy Instruments Inc., Oakville (CA)

(72) Inventors: Donald Jeffrey Dionne, Oakville (CA); Brian Leonard William Howse, Oakville (CA); Jennifer Marie McCann, Oakville (CA)

(73) Assignee: Smart Energy Instruments Inc., Oakville (CA)

( * ) Notice: Subject to any disclaimer, the term of this patent is extended or adjusted under 35 U.S.C. 154(b) by 0 days.

(21) Appl. No.: 14/907,596

(22) PCT Filed: Nov. 28, 2013

(86) PCT No.: PCT/CA2013/050912
§ 371 (c)(1),
(2) Date: Jan. 26, 2016

(87) PCT Pub. No.: WO2015/077859
PCT Pub. Date: Jun. 4, 2015

(65) Prior Publication Data
US 2016/0164531 A1 Jun. 9, 2016

(51) Int. Cl.
*H03L 7/085* (2006.01)
*H03L 7/099* (2006.01)
(Continued)

(52) U.S. Cl.
CPC .............. *H03L 7/0994* (2013.01); *G06F 1/02* (2013.01); *G06F 17/10* (2013.01); *H03L 1/00* (2013.01);
(Continued)

(58) Field of Classification Search
CPC ............ G06F 17/10; G06F 1/02; H03L 7/081; H03L 7/0994; H03L 7/095
(Continued)

(56) References Cited

U.S. PATENT DOCUMENTS

| 7,834,706 B2 | 11/2010 | Frey et al. | |
| 2010/0052797 A1* | 3/2010 | Carley | H03L 7/0814 331/18 |
| 2011/0095830 A1* | 4/2011 | Tsangaropoulos | G06F 1/025 331/34 |

OTHER PUBLICATIONS

IRIG Serial Time Code Formats, White Sands Missile Range Reagan Test Site Yuma Proving Ground Dugway Proving Ground Aberdeen Test Center National Training Center Electronic Proving Ground, Sep. 2004.
(Continued)

*Primary Examiner* — Arnold Kinkead
(74) *Attorney, Agent, or Firm* — Rowand LLP (57) ABSTRACT

A method for correcting long-term phase drift of a crystal oscillator in a numerically-controlled oscillator is described. The method includes determining the phase error in an oscillator signal in comparison with an external time base; delta-sigma modulating the phase error to generate a delta-sigma error bitstream; conditionally adding or subtracting an error correction step size from a phase increment value in each clock cycle based on the delta-sigma error bitstream, to create a modulated phase increment value; and adding the modulated phase increment value to a phase accumulator to generate an error-corrected output digital signal. The delta-sigma-based error correction method avoids the use of multipliers. The same delta-sigma error signal can be used in multiple numerically-controlled oscillators configured to different output frequency if driven by the same reference oscillator.

22 Claims, 6 Drawing Sheets (51) Int. Cl.
    *H03L 7/095*     (2006.01)
    *G06F 17/10*     (2006.01)
    *G06F 1/02*     (2006.01)
    *H03L 1/00*     (2006.01)
    *H03L 7/081*     (2006.01)
    *H03M 3/00*     (2006.01)

(52) U.S. Cl.
    CPC ............... *H03L 7/081* (2013.01); *H03L 7/095* (2013.01); *H03M 3/30* (2013.01)

(58) Field of Classification Search
    USPC . 375/374, 356, 376; 327/105, 107; 331/1 A, 331/18, 34; 341/118; 713/400; 708/271, 708/272
    See application file for complete search history.

(56) References Cited

OTHER PUBLICATIONS

A Wideband 2.4 GHz Delta-Sigma Fractional-N PLL with 1-mb/s In-Loop Modulation, Sudhakar Mamarti, Jan. 17, 2003.
International Search Report dated Jul. 21, 2014.
International Preliminary Report on Patentability dated Aug. 26, 2015.

\* cited by examiner

METHODS AND DEVICES FOR ERROR CORRECTION OF A SIGNAL USING DELTA SIGMA MODULATION

FIELD

The present application generally relates to frequency synthesizers and, in particular, to methods and devices for generating an error-corrected signal in a numerically-controlled oscillator.

BACKGROUND

Figure 1:
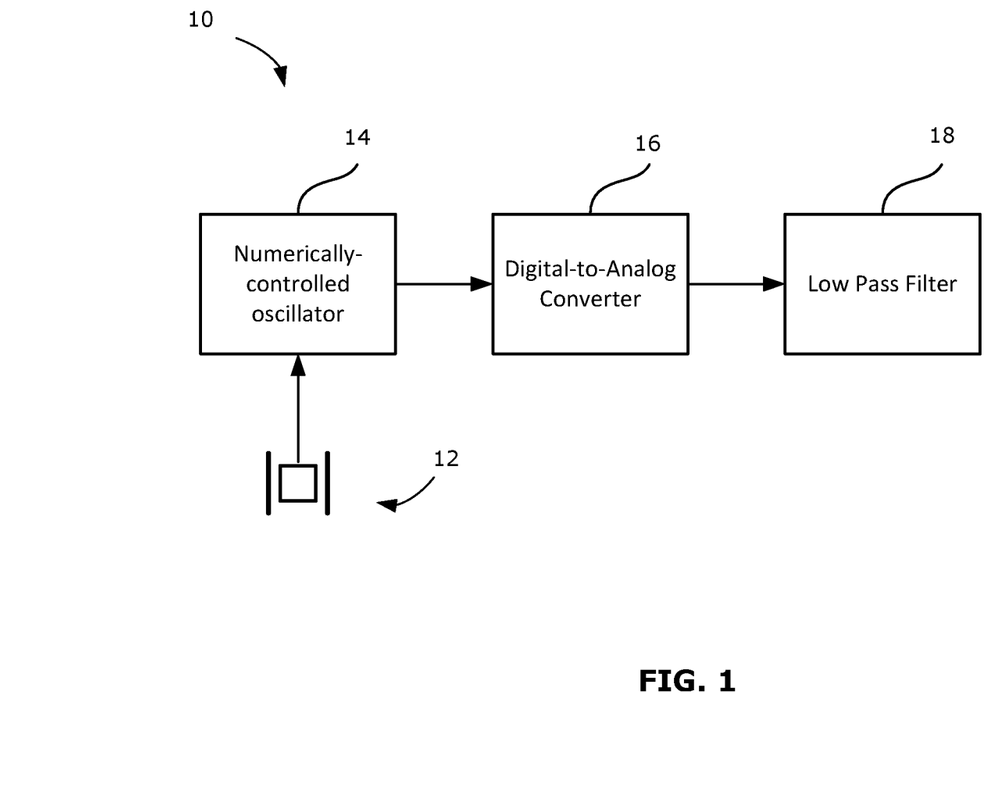
FIG. 1 shows a simplified block diagram of a direct digital synthesizer.

Direct digital synthesizers (DDS) are a class of numeric oscillators capable of generating a range of waveforms at a variety of easily-adjustable frequencies from a single, fixed-frequency, reference oscillator. The reference oscillator, however, is always subject to accuracy and stability errors relative to an absolute time base such as provided by GPS or other such standardized time base references. Reference is made to FIG. 1, which shows a simplified block diagram of an example DDS 10. The DDS 10 includes a reference clock oscillator 12, which in this example is shown as a piezoelectric crystal oscillator. The DDS 10 includes a numerically-controlled oscillator (NCO) 14. In this specific example, the DDS 10 includes a digital-to-analog converter (DAC) 16, and a low-pass filter (LPF) 18 for the purpose of producing an analog output signal, but in other examples the digital signal output from the NCO 14 may be used without analog conversion. The NCO 14 receives the fixed-frequency oscillator timing signal from the reference oscillator 12 and creates a digital signal having a desired waveform (e.g. a sinusoid in many embodiments) at a selected frequency.

The reference oscillator 12 that is used to generate the fixed-frequency oscillator signal is often a piezoelectric crystal oscillator. A piezoelectric crystal oscillator uses the mechanical resonance of a vibrating crystal (such as quartz) to create a signal with a very precise frequency. The use of crystal oscillators is desirable due to their stability in producing an electrical signal of precise frequency, based on the shape and mounting of the crystal. Crystal oscillators have accuracy and stability but are susceptible to short and long-term drift sometimes caused by environmental factors, such as temperature, and sometimes due to aging of the crystal. The short and long-term drift affects the phase and/or frequency of the generated clock signal used in the NCO 14. This results in a relative frequency offset of the crystal oscillator's nominal operating frequency. The reference oscillator 12 may be a timing source other than a piezoelectric crystal in some embodiments. Almost all timing sources suffer from some amount of accuracy and stability drift. The error in the oscillator signal from the reference oscillator leads directly to error in the phase and/or frequency of the signal produced by the NCO 14.

Various methods have been used in order to correct for the output error in the signal generated by a direct digital synthesizer due to error in signal from the reference oscillator. As an example, in the case of a crystal oscillator, the crystal resonance capacitance load may be adjustable through input of a voltage. The adjustment to the crystal capacitance may offset or partially compensate for the drift error. In another example, the impact of the error in the oscillator signal from the reference oscillator may be corrected within the NCO by changing the frequency word with a constant offset, i.e. adjusting the step-size, used in the numerically-controlled oscillator. Unfortunately, these current methods may be overly complex and/or lack the fine-grain accuracy necessary to adjust for drift error.

BRIEF DESCRIPTION OF THE DRAWINGS

Reference will now be made, by way of example, to the accompanying drawings, which show example embodiments of the present application, and in which.

DESCRIPTION OF EXAMPLE EMBODIMENTS

Methods, devices and systems for compensating for long-term phase drift of a reference oscillator are described. The reference oscillator may be used in generating a digital output signal, such as in a numerically-controlled oscillator. The method includes determining the phase error in an oscillator signal in comparison with an external time base; delta-sigma modulating the phase error to generate a delta-sigma error bitstream; conditionally adding or subtracting an error correction step size from a phase increment value in each clock cycle based on the delta-sigma error bitstream, to create a modulated phase increment value; and adding the modulated phase increment value to a phase accumulator to generate an error-corrected output digital signal. The delta-sigma-based error correction method avoids the use of multipliers. The same delta-sigma error signal can be used in multiple numerically-controlled oscillators configured to different output frequency if driven by the same reference oscillator.

In one aspect, the present application discloses a method for generating an error-corrected timing signal in a numerically-controlled oscillator, the numerically controlled-oscillator including a phase accumulator clocked at a clock cycle by an oscillator signal. The method includes, in each clock cycle, generating a modulated phase increment value based on a stored phase increment value by shifting the phase increment value by a predetermined bit shift to create an error correction step size, adding a sign to the error correction step size based upon a delta-sigma modulated error signal to produce a signed error correction step size, and adding the signed error correction step size to the phase increment value to produce the modulated phase increment value. The method further includes, in each clock cycle, adding the modulated phase increment value to an output value in the phase accumulator to create an updated output value, which is then stored in the phase accumulator.

In another aspect, the present application discloses a method for correcting long-term phase drift of a crystal oscillator in a numerically-controlled oscillator, the numerically controlled-oscillator having a phase increment value and including a phase accumulator clocked at a clock cycle by an oscillator signal from the crystal oscillator. The method includes determining the phase error in the in oscillator signal in comparison with an external time base; delta-sigma modulating the phase error to generate a delta-sigma error bitstream; conditionally adding or subtracting an error correction step size from the phase increment value in each clock cycle based on the delta-sigma error bitstream, to create a modulated phase increment value; and adding the modulated phase increment value to the phase accumulator to generate an error-corrected output digital signal.

In a further aspect, the present application discloses a system for generating an error-corrected digital signal having a selected frequency based on a reference crystal oscillator, wherein the oscillator outputs an oscillator signal at an oscillator frequency. The system includes a memory element storing a phase increment value; a phase accumulator clocked at the oscillator frequency; an error measurement circuit to determine the phase error in the oscillator signal in comparison with an external time base; a delta-sigma modulator to modulate the phase error and produce a delta-sigma error bitstream; and an error-correction circuit to conditionally add or subtract an error correction step size from the phase increment value in each clock cycle based on the delta-sigma error bitstream, to create a modulated phase increment value. The modulated phase increment value is added to the phase accumulator in each clock cycle to generate the error-corrected digital signal.

In yet a further aspect, the present application discloses a numerically-controlled oscillator for generating an error-corrected digital signal having a selected frequency based on a reference crystal oscillator, wherein the oscillator outputs an oscillator signal at an oscillator frequency. The numerically-controlled oscillator comprises a memory element storing a phase increment value; an error-correction circuit including a bit shifter to shift the phase increment value by a predetermined bit shift to create an error correction step size, wherein the error correction step size is given a sign based upon a delta-sigma modulated error signal to produce a signed error correction step size, and an adder to produce a modulated phase increment value from the sum of the phase increment value and the signed error correction step size; and a phase accumulator clocked at the oscillator frequency to add the modulated phase increment value to an output value to update and store the output value, wherein the updated output value is the error-corrected digital signal.

In one aspect, the present application discloses methods and devices for correcting for long term drift in a numerically-controlled oscillator without requiring multipliers. In another aspect, the present application discloses methods and devices for correcting for long term drift in a plurality of numerically-controlled oscillators having different set frequencies and driven by the same reference oscillator, with a common error measurement circuit.

Other aspects and features of the present application will be understood by those of ordinary skill in the art from a review of the following description of examples in conjunction with the accompanying figures.

Figure 2:
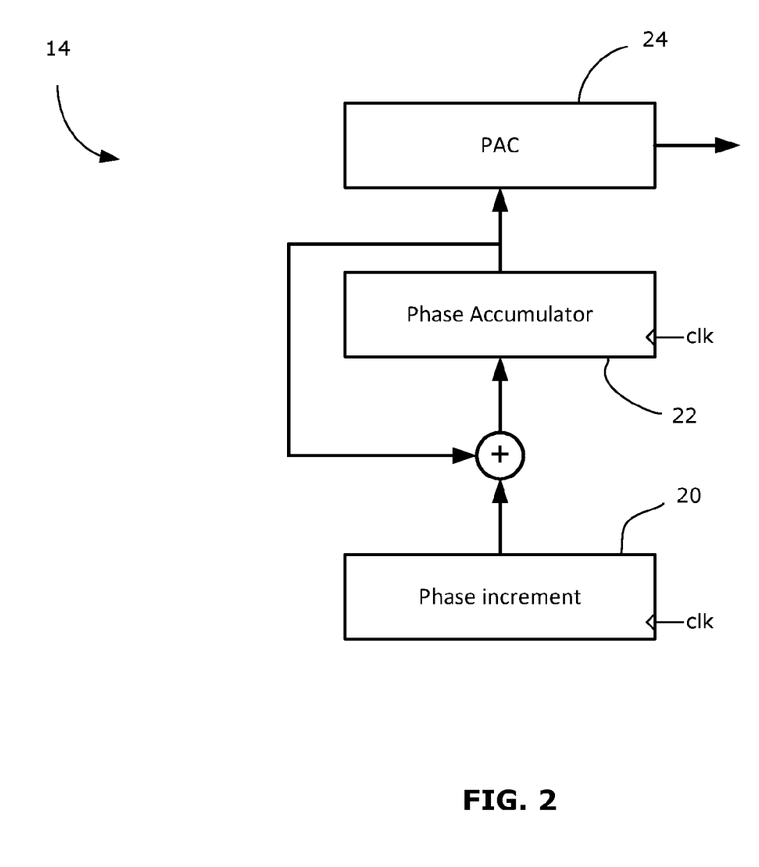
FIG. 2 shows a partial block diagram of a numerically-controlled oscillator used in a direct digital synthesizer.

Reference is first made to FIG. 2, which shows a partial block diagram of the typical numerically-controlled oscillator 14. In this example, the numerically-controlled oscillator 14 includes a phase increment register 20 and a phase accumulator 22. The phase increment register 20 stores the phase increment/step-size. The phase accumulator 22 is clocked by a clock signal, such as the oscillator signal from a reference oscillator. The reference oscillator may be a crystal oscillator in some cases. The output of the phase accumulator 22 is fed back to have the phase increment added to it at each clock cycle. In effect, when the phase increment is held constant, the output of the phase accumulator 22 is a linear digital ramp. When the phase accumulator 22 overflows, the numerical wraparound results in the output signal effectively transforming into a digital saw-tooth waveform having a periodicity that is a function of the frequency of the clock signal and magnitude given by 2 to the power of the bit width, w, of the phase accumulator 22.

This example of a numerically-controlled oscillator 14 further includes a digital waveform generator, which in this example is shown as a phase-to-amplitude converter (PAC) 24. The PAC 24 is configured to generate an output digital signal (such as a sinusoid) with a frequency set based on the output signal from the phase accumulator 22. The PAC 24 may be implemented using a look-up table in some instances.

It will be understood that drift error in the reference oscillator signal used to clock the phase accumulator will directly impact the resulting phase of the output signal from the phase accumulator.

In accordance with one aspect of the present application, a novel numerically-controlled oscillator is described below that applies error correction derived from a higher accuracy source (e.g., GPS or IRIG B) to compensate for errors due to the imperfect oscillator signal of a lower accuracy reference, such as a crystal oscillator. The error correction method and devices described are capable of fine phase increment adjustments to the step size through use of a Delta-Sigma modulation of the error signal. Advantageously, the Delta-Sigma modulation of the error signal may be used to modify the phase increment without requiring multiplications. The phase increment is adjusted by selectively adding or subtracting a shifted version of the phase increment in accordance with the Delta-Sigma modulated error signal. Moreover, in some embodiments multiple NCOs may share the same reference oscillator signal and Delta-Sigma error correction signal, thereby reducing component count. In a multi-channel embodiment, each NCO may be set to its own desired frequency without dependence on each other.

Figure 3:
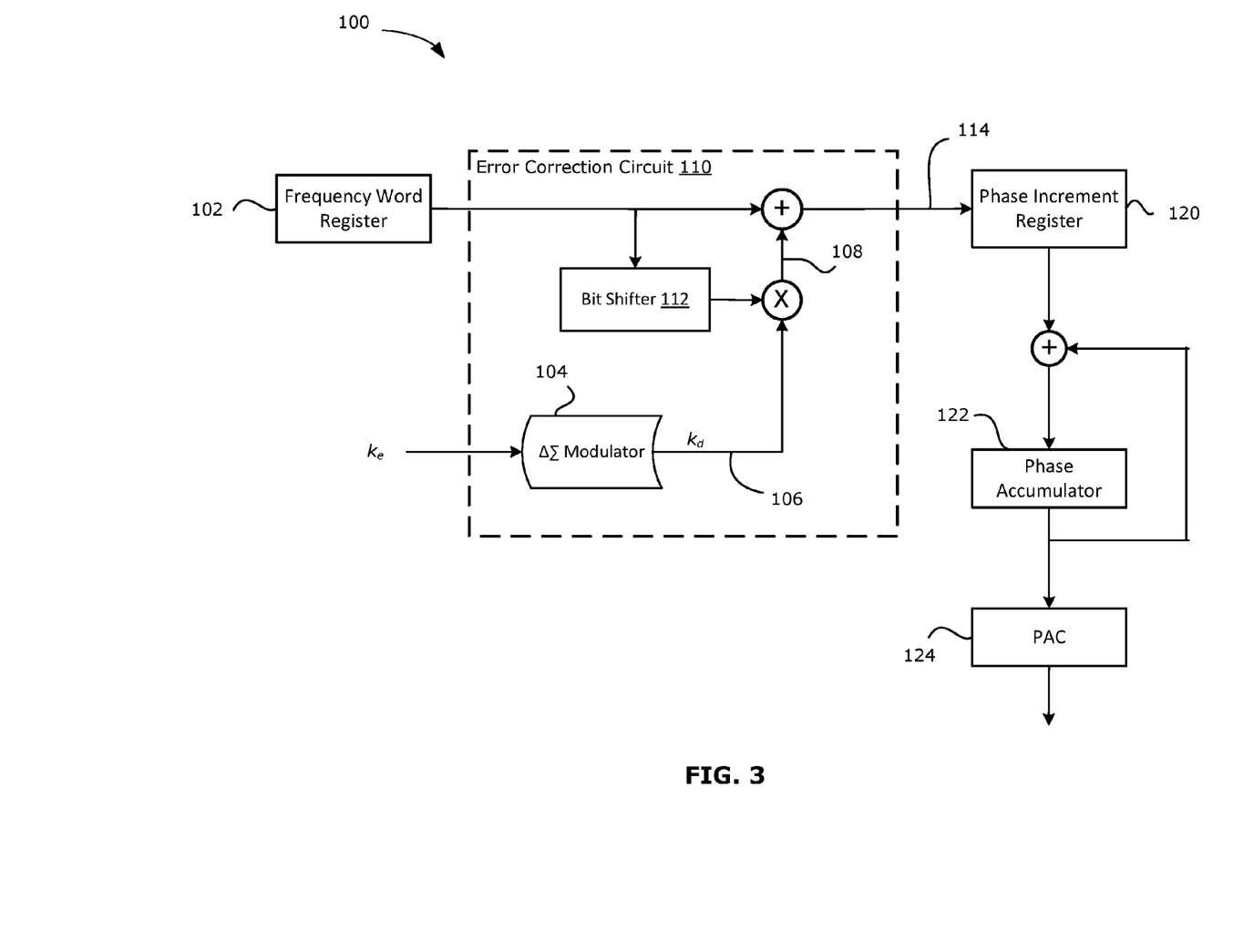
FIG. 3 shows a simplified block diagram of one example of a numerically-controlled oscillator in accordance with one aspect of the present application.

Reference is now made to FIG. 3, which shows a simplified block diagram of one example embodiment of an error-corrected numerically-controlled oscillator (NCO) 100. The example NCO 100 includes a frequency word register 102 configured to store a multi-bit frequency word. The multi-bit frequency word is the phase increment step-size intended for use in the NCO 100. Selection of the multi-bit frequency word determines the output frequency of the NCO 100, as will be explained further below. The term "frequency word" and "phase increment" may be used interchangeably herein.

The NCO 100 further includes a phase increment register 120, a phase accumulator 122, and a PAC 124. An error correction circuit 110 reads the multi-bit frequency word from the frequency word register 102, makes minor phase increment adjustments for error correction based on a highly-accurate error signal $k_e$ sampled by a Delta-Sigma modulator (DSM) 104. The corrected frequency word is loaded into the phase increment register 120. Accordingly, the error correction circuit 110 may adjust the frequency word each clock cycle (e.g. at the oscillator frequency), if necessary, and may load the new modulated correction frequency word into the phase increment register 120 at each clock cycle, thereby leading to corrected step size increments used in each clocking of the phase accumulator 122. The error correction circuit 110 is described in detail below.

The frequency word register 102 may be a standard memory register capable of storing a binary word. In a simple embodiment, the frequency word register 102 may contain a fixed predetermined binary word. In other embodiments, the NCO 100 may be implemented within a DDS or other device that is capable of occasionally changing the desired frequency. Thus, the frequency word register 102 may be capable of being overwritten by a write signal (serial or parallel) to change the multi-bit frequency word. In some implementations, the NCO 100 may be implemented in software on a general purpose computer or other processing device, in which case the frequency word register 102 may be an allocation of memory accessible to the processor(s). The memory may be integrated with or physically separate from the processing device(s). In a discrete digital chip embodiment, the frequency word register 102 may be a stand-alone integrated circuit in some cases. In some other cases, the frequency word register 102 may be integrated within an IC package containing one or more of the components of the NCO 100, the entire NCO 100, or the NCO 100 and additional digital signal processing elements. The above comments regarding the possible implementations of the frequency word register 102 apply to other registers described in the present application, as will be appreciated by those ordinarily skilled in the art. Accordingly, the term "register" as used herein is not intended to limit the nature of the implementation to stand-alone digital IC registers, but may include a wide range of memory elements capable of storing binary data, which may be integrated with other components of the NCO 100. Moreover, the term "word" is not intended to suggest that the frequency word has a particular number of bits. The word size may include typical CPU sizes of 8, 16, 24, 32, or 64 bits or other variations of arbitrary bit length including non-power-of-two word sizes, which are easily implemented in FPGA or ASIC designs. As will be discussed below, such a minimum register size may be desired in order to achieve a predetermined accuracy for a frequency output by the frequency word register 102 or other registers in the NCO 100.

The error correction circuit 110 includes the Delta-Sigma Modulator (DSM) 104 that samples the error signal $k_e$ from a high-accuracy phase-locked signal such as that of a GPS timing reference, for example. The DSM 104 is illustrated as part of the error correction circuit 110 in this example. In other examples, the DSM 104 may be implemented within a broader device containing one or more NCOs 100. The DSM 104 outputs a DSM error signal 106, $k_d$, which is a 1-bit signal (±1 encoded in binary 0 and 1) pulse-density encoding the error in the phase of a signal based on the oscillator frequency phase-locked to the higher accuracy source. An example circuit for obtaining the error signal $k_e$ is described further below.

The error correction circuit 110 includes a bit shifter 112 that reads the multi-bit frequency word from the frequency word register 102 and applies a right bit shift of b bits. The resulting shifted frequency word is the error correction step size. A logical shift right is sufficient over an arithmetic shift right as the frequency word register being shifted is unsigned. This shifted value is then "multiplied" with the DSM error signal 106. However, no actual multiplication is required since a single bit DSM output is resolved to a simple conditional add or subtract; whether implemented in hardware or software, the effect of the "multiplication" of the DSM error signal 106 with the error correction step size is to render the error correction step size positive or negative, i.e. to conditionally change its sign, depending upon the DSM error signal 106 to produce a signed error correction step size 108. The signed error correction step size 108 is then added to the frequency word from the frequency word register 102 to produce a modulated phase increment value 114 for storage in the phase increment register 120. The DSM error signal 106 can be viewed as a conditional add or subtract depending on the binary value of the single bit DSM stream (zero or one). The shifting, conditional sign modification, and adding operations may be implemented in a number of ways depending on the embodiment, including through software, standard IC components (e.g., bit shifters, discrete logic components, etc.), hard-wired shifts, etc.

The DSM error signal 106 bitstream from the DSM 104 is a one-bit signal encoding the error $k_e$ measured in the phase of a signal generated from the reference oscillator and compared to a high-accuracy time-base. In one example, the reference oscillator signal is used to clock an oscillator-driven NCO (not illustrated) that is configured to produce a timing signal at the same frequency as the high-accuracy time-base. In one example, the high-accuracy time-base may include a GPS signal, for example at 1 Hz, and the oscillator-driven NCO may be set to the same frequency, such as 1 Hz. Any errors in the reference oscillator signal will result in phase or frequency error in the output timing signal from the oscillator-driven NCO. The error measurement may be based upon a phase comparison (e.g. a phase-locked loop) between the timing signal of the oscillator-driven NCO and the external time-base signal. The phase comparison may be configured in one embodiment, as a phase-locked loop to filter out short term variations and extract long term stability. In one example, the external time-base signal may include a GPS signal driven by an atomic clock and in another example the time-base may be IRIG B or other source of high-accuracy timing reference. The external time-base signal may have short-term jitter or noise, but may have a stable long-term frequency that enables accurate phase error measurement with respect to the output signal over the long term.

The DSM error signal 106 results in a positive or negative error correction step size 108 applied to the multi-bit frequency word every clock cycle, thereby shifting the phase increment (nominally a step size based on the multi-bit frequency word) either up or down by the error correction step size 108 on each clock cycle. The phase error encoded in the DSM error signal 106 accounts for the relative number of +1 or −1 bit occurrences and, thus, the relative number of occurrences of the increased or decreased phase increment value.

Referring still to FIG. 3, the NCO 100 may further include a PAC 124 for generating a digital waveform in a desired shape having a frequency and phase based on the phase accumulator 122 input signal.

The desired accuracy for the NCO 100 may be used to select a size for the phase accumulator 122. The size (width) of the register is denoted w. If the register is incremented by n each cycle, then the wrap around period is given by:

$$P_{cyc} = \frac{2^w}{n}$$

If $f_{osc}$ is the frequency of the oscillator signal, i.e. the frequency at which the register increments (e.g. the clock frequency for the NCO 100), then the resulting frequency $f_{cyc}$ of the register wrap-around is:

$$f_{cyc} = \frac{nf_{osc}}{2^w}$$

A target accuracy may be established. For example, in one example, the desired accuracy may be to be within 6 μs per 24 hours, which translates to a numerical accuracy of $69.44 \times 10^{-12}$.

Based on a desired accuracy, and assuming a oscillator frequency of, for example, 125 MHz, the width may be determined by setting $f_{cyc}/n$ to the desired accuracy:

$$69.44 \times 10^{-12} = \frac{f_{osc}}{2^w}$$

$$2^w = 1.8 \times 10^{18}$$

$$w = 60.64$$

Accordingly, in this example the minimum register width needed to achieve the desired accuracy is 61 bits. The phase increment step size, $P_{step}$, to achieve a desired set frequency, $f_{set}$, for an NCO having an accumulator size of w is then determined by:

$$P_{step} = \frac{f_{set} * 2^w}{f_{clk}}$$

The external oscillator that generates the reference clock signal may be selected from a variety of possible oscillators. For example, in at least some example embodiments, the external oscillator may be a crystal oscillator (XO), a temperature-controlled oscillator (TCXO) or an oven-controlled crystal oscillator (OCXO). An oscillator of a particular type may further include a range of different characteristics (such as, frequencies, power output levels, noise levels, phase drifts, etc.).

In an example embodiment, the expected or projected long-term error may be determined based upon the specified aging drift of the oscillator (i.e. the long-term phase drift of the oscillator signal). The aging drift of an oscillator signal is a predefined value that is provided by the manufacturer of the particular oscillator. For example, for a prototypical OCXO oscillator, the aging drift may be specified as $\pm 3 \times 10^{-8}$ per year, i.e. 30 parts per billion (ppb). By comparison, the accuracy of GPS time is $\pm 1 \times 10^{-13}$ and does not drift annually.

The aging drift is usually specified on an annual basis. It may be desirable in some cases to base the error correction capacity of the NCO 100 on the aging drift over a number of years (e.g. 10-20 years). For example, if a typical OCXO oscillator has a long-term drift of $\pm 3 \times 10^{-8}$ per year, then it may be desirable to ensure the NCO is capable of a correction range of up to $\pm 6 \times 10^{-7}$ to fully compensate for aging drift over a 20 year period (i.e. $\pm 3 \times 10^{-8} \times 20$). The number of years used and the approximation for drift may vary depending on the implementation and design considerations.

After the desired correction range, e, is determined, the correction range may be related to the NCO frequency values as follows:

$$f_{out} = f_{set}(1 \pm e)$$

The corrected phase increment value may be expressed as, $$P_{stepcorrected} = P_{step}\left(1 \pm \frac{k_d}{2^b}\right)$$

$$= P_{step} \pm \frac{P_{step}}{2^b} k_d$$

$$= P_{step} \pm \frac{P_{step}}{2^b} DSM(k_e)$$

In this equation, the phase increment step correction is expressed as a power of two shift of $P_{step}$ multiplied by $k_d$ which is a delta-sigma modulated version of parameter of $k_e$. The parameter $k_e$ is the phase error between the oscillator signal and the external time base. Notably, the correction of the phase increment value resolves down to an add or subtract rather than a multiply. In other words, the error correction to compensate for long term drift of the oscillator signal may be implemented without requiring a costly multiplication operation.

In order to determine the error correction step size ($P_{step}/2^b$), a suitable number of bits b by which the phase increment value is to be shifted is determined. The bit shift b may be related to the desired correction range e. One example set of relations for finding a suitable bit shift b is shown below, although the present application is not limited to this example and other approaches may be used to determine a bit shift b suitable for a particular embodiment.

$$\frac{k_d}{2^b} = \frac{DSM(k_e)}{2^b} \approx e,$$

where b is the bit shift

Recall that the desired correction range e was determined based on the approximate drift error of the crystal and the number of years over which drift may occur (20 in this example scenario), and a value of $\pm 6 \times 10^{-7}$ was obtained. In this embodiment, the bit shift is determined using that estimate for the long term correction range:

$$b = \frac{-\log(e)}{\log(2)}$$

$$b = \frac{-\log(6 \times 10^{-7})}{\log(2)}$$

$$b = 20.67$$

Rounding down, 20 bits of shift may be needed to make the fine adjustments required to compensate for the 20-year drift. Because a DSM signal is being used in the error correction circuit 110, in some types of implementation, to avoid instability of the modulation the input may be bounded by ±0.5 (dependent on DSM architecture and algorithm used). If that is the case, then the size of the bit shift may be reduced by one to 19 to account for the half scale amplitude bound relative to the nominal ±1.0. Also note that the smaller the expected correction range (i.e. the smaller the drift), then the greater the bit shift required to make the small adjustments for correcting such small drifts. In other words, the more accurate the reference clock signal is expected to be, the smaller the error signal will be for making corrections in the error correction circuit 110.

It will be appreciated that the actual bit shift is an integer value, whereas the calculation of the desired b for realizing a particular correction range resulted in a real number. The integer bit shift will thus result in a different maximum correction range that was specified as the desired correction range. The foregoing example results in a maximum correction range as follows:

$$DSM \times \frac{1}{2^b}$$

which becomes $0.5/2^{19}$, or $9.54 \times 10^{-7}$

In other words, in this example, the modulated phase increment computed each cycle for storage in the phase increment register is $P_{step}$ ($1 \pm 9.54 \times 10^{-7}$), where the ± operator is dependent upon the DSM error correction signal.

The foregoing selection of register width w based on a desired accuracy for a given output set frequency and oscillator frequency helps to ensure that the frequency word (i.e. phase increment $P_{step}$) is sufficiently large that when shifted by b bits it still results in a non-zero error correction signal. It will be appreciated that if the phase increment word size is not sufficiently large enough in comparison to the bit shift b, then the portion of the word extracted for the shifting operation may result in shifting all of the remaining bits to zero and thus no correction would occur, or not enough correction if different channels use different bits.

Referring still to FIG. 3, it will be appreciated that the processes performed by the NCO 100 occur within one or more oscillator (e.g. clock) cycles. For example, the operations of adding of the signed error correction step size 108, the storing of the modulated error-corrected phase increment value 114 in the phase increment register 120, and the updating of the phase accumulator 122 are each clocked by the oscillator clock signal, at the frequency of $f_{osc}$, in this example. In at least some example embodiments, the propagation delay through the NCO 100 is three clock cycles.

In at least one sense, the modulation of the phase increment value with an error correction step size that is either positive or negative depending on the Delta-Sigma modulated error signal $k_d$ may be viewed as phase dithering.

Figure 4:
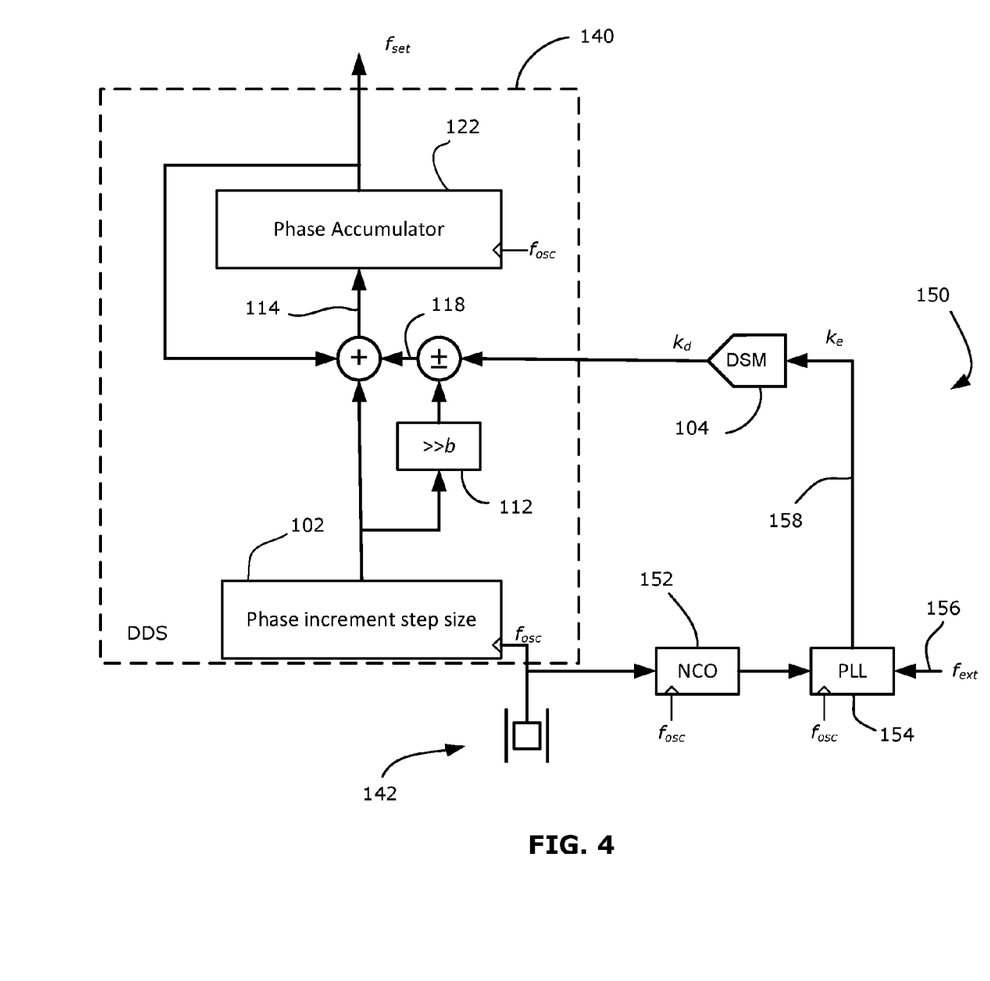
FIG. 4 shows, in block diagram form, an example numerically-controlled oscillator together with an error measurement circuit.

Reference is now made to FIG. 4, which shows, in block diagram form, an example block diagram of an NCO, which in this case is being used as a direct digital synthesizer (DDS) 140, together with an error measurement circuit 150. The DSM 104 is this embodiment is depicted as being outside the DDS 140, but it could be depicted as part of the DDS 140 in some embodiments. The reference oscillator in this example is a piezoelectric crystal oscillator 142 that outputs an oscillator clock signal at the frequency $f_{osc}$.

The DDS 140 includes the frequency word register 102, labeled as Pstep, which contains the phase increment/step size in binary form. The DDS 140 further includes the bit shifter 112, and the conditional add/subtract of the error corrected step size 108 based on an input DSM signal $k_d$ from the DSM 104. In this example diagram, the modulated error-corrected phase increment value 114 is fed into the phase accumulator 122 without being pre-stored in a phase increment register 120. The components of the DDS 140 are clocked at the oscillator 142 frequency $f_{osc}$.

The error measurement circuit 150 is configured to compare the output of the crystal oscillator 142 with an external time base 156. The external time base 156 may be a long-term high-accuracy time signal, such as, for example, a GPS signal, an IRIG-B signal, or other such timing source. To compare the two time sources, the output of the crystal oscillator is used to create a signal having the same nominal frequency as the external time base 156. In one specific example, this may be a 1 Hz signal from a GPS receiver. Other frequencies may be used in other embodiments. The oscillator output at frequency $f_{osc}$ is used to drive an NCO 152 configured to generate a signal (digital, in this embodiment) at frequency $f_1$, which is intended to be the same as the frequency of the external time base 156. The output of the NCO 152 and the signal from the external time based 156 are phase compared, such as through a phase-locked loop (PLL) 154 or the like, to detect the long-term phase error between the oscillator-generated signal $f_1$ and the external time base signal. This error $k_e$, denoted 158, reflects the long term drift error in the actual output frequency of the crystal and its nominal operating frequency. That error, $k_e$, is then input to the DSM 104 to generate the modulated bitstream DSM error signal $k_d$ at the frequency $f_{osc}$.

Figure 6:
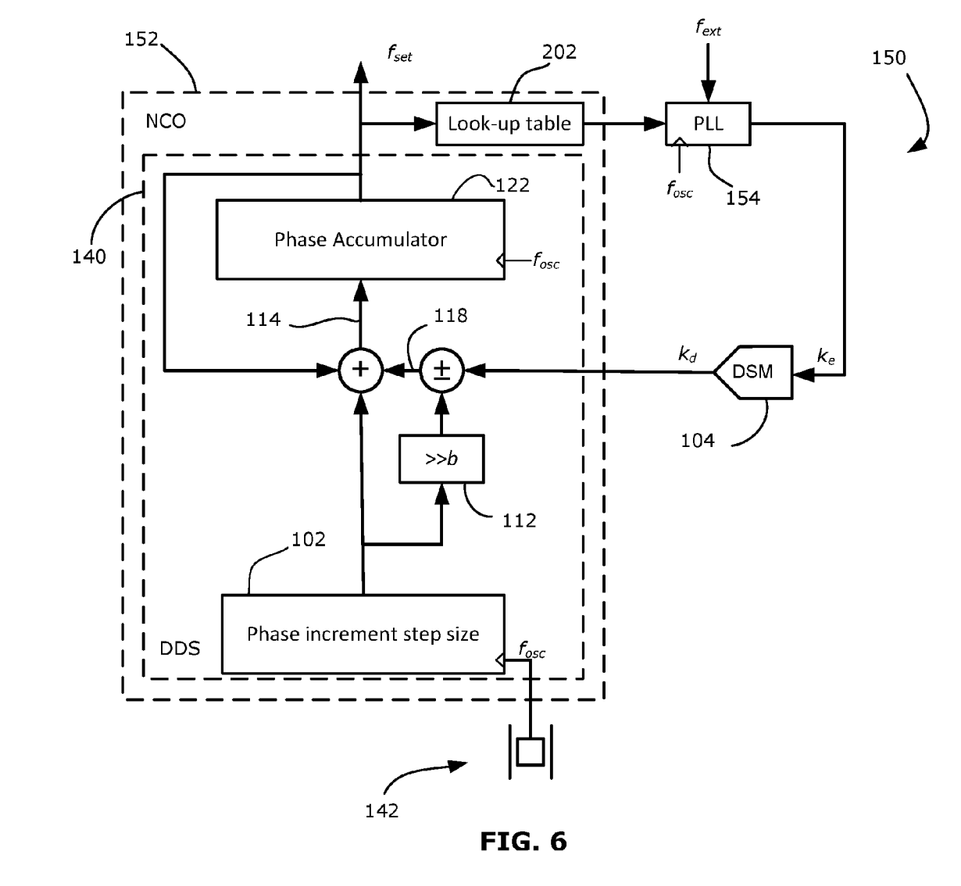
FIG. 6 shows, in block diagram form, another example of a numerically-controlled oscillator together with an error measurement circuit.

For clarity, the error measurement circuit 150 is illustrated in FIG. 4 as being distinct from the DDS 140. In some embodiments, however, the NCO 152 within the error measurement circuit 150 may use the DDS 140 to generate the sinusoidal signal within the NCO 152, rather than duplicating those components in another DDS circuit. FIG. 6 shows, in block diagram form, an example embodiment in which the DDS 140 is used within the NCO 152. In this example, it will be noted that the output of the DDS 140, $f_{set}$ or $f_{out}$, is used to generate a sinusoid signal in the NCO 152 using, for example, a sine look-up table 202 or any similar mechanism. The sinusoid signal is then input to the PLL 154 to measure the error $k_e$. the sine look-up table 202 is configured to produce a sinusoidal signal at the frequency of the external time base 156 when driven by the oscillator at its nominal frequency.

Figure 5:
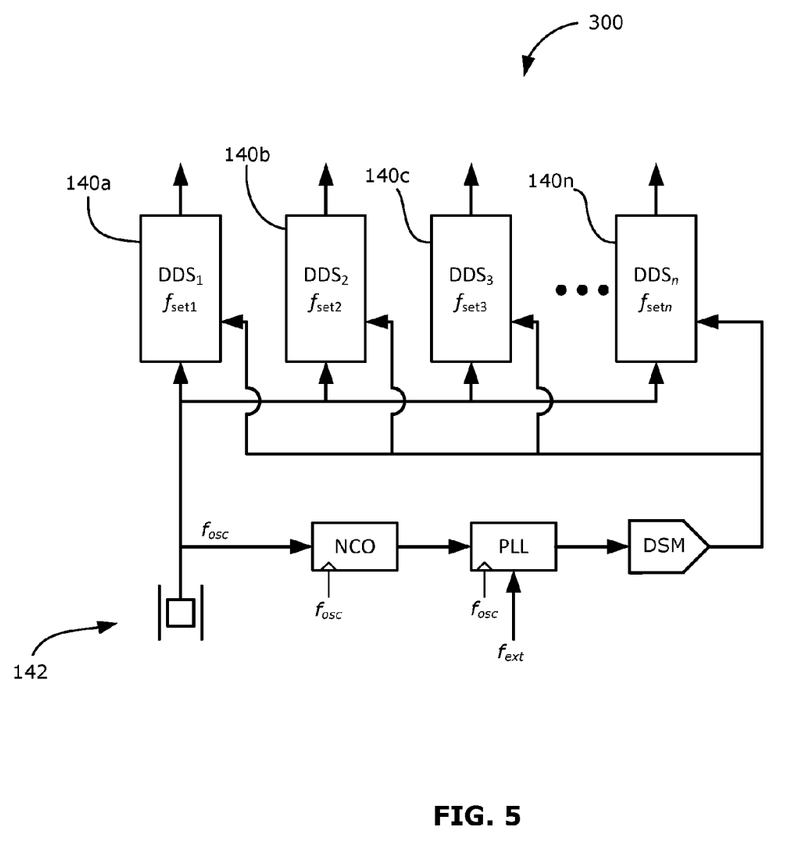
FIG. 5 shows a diagram of an example system having multiple DDSs sharing a common reference oscillator and error measurement circuit.

Reference is now made to FIG. 5, which shows an example system 300 containing multiple DDSs 140 (labeled individually as 140a, 140b, . . . , 140n) sharing a common reference oscillator 142 and the error measurement circuit 150. Notably, the same crystal reference oscillator 142 is used to drive each DDS 140, each of which may be configured with a phase increment step size unrelated to any other DDS 140, so that each DDS 140 could produce a signal having a frequency unrelated to the frequency of other DDSs 140 in the system 300. It will also be noted that only one error measurement circuit 150 need be used to correct for the oscillator drift in every DDS 140 in the system 300. The same DSM error signal $k_d$ is input to each DDS 140, where it is used to drive the conditional add/subtract of the error correction step size (based on a shifted phase increment value of that DDS 140) from the phase increment value of that DDS 140.

In another embodiment, to save hardware, the DDSs 140 are implemented using multi-channel hardware, such as a frequency word bank for storing the phase increment values for the various DDSs 140.

It will be appreciated that the NCO or DDS circuits described herein may include other components including hardware and software components (for example, other types of bit shifters, adders, inverters, etc.), one or more microprocessors or microcontrollers (for example, to control the overall operation of the NCO or DDS, and to work in conjunction with the bit shifters, adders, inverters, etc. to perform the processes described above).

It will be understood that the above-described devices may be implemented partly in hardware and partly in software. In some embodiments, the implementation may include one or more field programmable gate arrays (FPGA). In some embodiments, the implementation may include one or more application-specific integrated circuits (ASIC). The phase detection and loop filter may be hardware, software, or a combination. The selection of particular hardware components may be based upon cost, speed, operating environment, etc. The selection and programming of such components will be within the understanding of a person of ordinary skill in the art having regard to the detailed description provided herein.

In yet a further aspect, the present application discloses a non-transitory computer-readable medium having stored thereon computer-executable instructions which, when executed by a processor, configure the processor to execute any one or more of the processes described above.

Certain adaptations and modifications of the described embodiments can be made. Therefore, the above-discussed embodiments are considered to be illustrative and not restrictive.

What is claimed is:

1. A method for generating an error-corrected timing signal in a numerically-controlled oscillator, the numerically controlled-oscillator including a phase accumulator clocked at a clock cycle by an oscillator signal, the method comprising:
in each clock cycle, generating a modulated phase increment value based on a stored phase increment value by
shifting the phase increment value by a predetermined bit shift to create an error correction step size,
adding a sign to the error correction step size based upon a delta-sigma modulated error signal to produce a signed error correction step size, and
adding the signed error correction step size to the phase increment value to produce the modulated phase increment value; and
in each clock cycle, adding the modulated phase increment value to an output value in the phase accumulator to create an updated output value, which is then stored in the phase accumulator.

2. The method claimed in claim 1, wherein generating the modulated phase increment value requires no multiplication.

3. The method claimed in claim 1, wherein the delta-sigma modulated error signal comprises a binary bitstream that pulse-density modulates an error measurement in the oscillator signal as compared to an external time base.

4. The method claimed in claim 3, wherein adding the sign comprises making the error correction step size positive or negative depending upon the binary value of the delta-sigma modulated error signal.

5. The method claimed in claim 1, further including generating the delta-sigma modulated error signal by:
comparing the oscillator signal to an external time base to produce an error measurement; and
delta-sigma modulating the error measurement to produce the delta-sigma modulated error signal.

6. The method claimed in claim 5, wherein comparing comprises generating a timing signal at the same frequency as the external time base using the oscillator signal and comparing the timing signal with the external time base in a phase-locked loop.

7. The method claimed in claim 1, wherein a crystal oscillator produces the oscillator signal.

8. A method for correcting long-term phase drift of a crystal oscillator in a numerically-controlled oscillator, the numerically controlled-oscillator having a phase increment value and including a phase accumulator clocked at a clock cycle by an oscillator signal from the crystal oscillator, the method comprising:
determining the phase error in the in oscillator signal in comparison with an external time base;
delta-sigma modulating the phase error to generate a delta-sigma error bitstream;
conditionally adding or subtracting an error correction step size from the phase increment value in each clock cycle based on the delta-sigma error bitstream, to create a modulated phase increment value; and
adding the modulated phase increment value to the phase accumulator to generate an error-corrected output digital signal.

9. The method claimed in claim 8, wherein the conditionally adding or subtracting requires no multiplication.

10. The method claimed in claim 9, wherein the method is implemented without requiring multiplication.

11. The method claimed in claim 8, wherein conditionally adding or subtracting comprises setting a sign of the error correction step size and adding the signed error correction step size to the phase increment value.

12. The method claimed in claim 8, wherein determining the phase error comprises:
generating a timing signal at the same frequency as the external time base using the oscillator signal; and
comparing the timing signal with the external time base in a phase-locked loop to determine the phase error.

13. A system for generating an error-corrected digital signal having a selected frequency based on a reference crystal oscillator, wherein the oscillator outputs an oscillator signal at an oscillator frequency, the system comprising:
a memory element storing a phase increment value;
a phase accumulator clocked at the oscillator frequency;
an error measurement circuit to determine the phase error in the oscillator signal in comparison with an external time base;
a delta-sigma modulator to modulate the phase error and produce a delta-sigma error bitstream; and
an error-correction circuit to conditionally add or subtract an error correction step size from the phase increment value in each clock cycle based on the delta-sigma error bitstream, to create a modulated phase increment value,
wherein the modulated phase increment value is added to the phase accumulator in each clock cycle to generate the error-corrected digital signal.

14. The system claimed in claim 13, further comprising a plurality of phase increment values and corresponding phase accumulators and corresponding error-correction circuits having corresponding error correction step sizes, and wherein each error-correction circuit receives the common delta-sigma error bitstream to conditionally add or subtract its corresponding error correction step size from its corresponding phase increment value.

15. The system claimed in claim 14, wherein each of the plurality of phase increment values and their respective corresponding phase accumulators and corresponding error-correction circuits comprise separate numerically-controlled oscillators each producing its respective error-corrected digital signal.

16. The system claimed in claim 15, wherein each of the numerically-controlled oscillators is implemented without multipliers.

17. The system claimed in claim 13, wherein the error-correction circuit includes a bit shifter to shift the phase increment value to generate the error correction step size.

18. A numerically-controlled oscillator for generating an error-corrected digital signal having a selected frequency based on a reference crystal oscillator, wherein the oscillator outputs an oscillator signal at an oscillator frequency, comprising:

a memory element storing a phase increment value;
an error-correction circuit including
- a bit shifter to shift the phase increment value by a predetermined bit shift to create an error correction step size, wherein the error correction step size is given a sign based upon a delta-sigma modulated error signal to produce a signed error correction step size, and
- an adder to produce a modulated phase increment value from the sum of the phase increment value and the signed error correction step size; and a phase accumulator clocked at the oscillator frequency to add the modulated phase increment value to an output value to update and store the output value, wherein the updated output value is the error-corrected digital signal.

19. The numerically-controlled oscillator claimed in claim 18, wherein error-correction circuit contains no multipliers.

20. The numerically-controlled oscillator claimed in claim 18, wherein the error-correction circuit contains a delta-sigma modulator to receive an error measurement between the oscillator signal and an external time based, and wherein the delta-sigma error signal comprises a binary bitstream that pulse-density modulates the error measurement.

21. The numerically-controlled oscillator claimed in claim 20, wherein the error-correction circuit includes a conditional logic element making the error correction step size positive or negative depending upon the binary value of the delta-sigma modulated error signal.

22. The numerically-controlled oscillator claimed in claim 18, further comprising a crystal oscillator to produce the oscillator signal.

* * * * *